(12) United States Patent
Tang et al.

(10) Patent No.: US 6,858,934 B2
(45) Date of Patent: Feb. 22, 2005

(54) SEMICONDUCTOR DEVICE STRUCTURES INCLUDING METAL SILICIDE INTERCONNECT STRUCTURES THAT EXTEND AT LEAST PARTIALLY OVER TRANSISTOR GATE STRUCTURES AND METHODS FOR MAKING THE SAME

(75) Inventors: Sanh D. Tang, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/795,746

(22) Filed: Feb. 28, 2001

(65) Prior Publication Data

US 2001/0009303 A1 Jul. 26, 2001

Related U.S. Application Data

(62) Division of application No. 09/291,762, filed on Apr. 14, 1999, now Pat. No. 6,429,124.

(51) Int. Cl.[7] .............................................. H01L 23/48
(52) U.S. Cl. ...................... 257/755; 257/758; 257/369
(58) Field of Search ................................. 257/758, 755, 257/757, 760, 369, 368

(56) References Cited

U.S. PATENT DOCUMENTS

| | | | |
|---|---|---|---|
| 4,103,415 A | 8/1978 | Hayes | |
| 4,305,200 A | 12/1981 | Fu et al. | |
| 4,682,404 A | 7/1987 | Miller et al. | |
| 4,975,756 A | 12/1990 | Haken et al. | |
| 5,340,761 A | * 8/1994 | Loh et al. ................... | 438/303 |
| 5,341,016 A | 8/1994 | Prall et al. | |
| 5,360,757 A | 11/1994 | Lage | |
| 5,387,535 A | * 2/1995 | Wilmsmeyer ............... | 438/621 |
| 5,482,895 A | * 1/1996 | Hayashi et al. ............. | 438/620 |

(List continued on next page.)

FOREIGN PATENT DOCUMENTS

JP 59072741 A 4/1984

OTHER PUBLICATIONS

Thomas E. Tang et al., *Titanium Nitride Local Interconnect Technology For VLSI*, IEEE Transactions On Electron Devices. vol. ED–34, No. 3. Mar. 1987.
IBM Technical Disclosure Bulletin NN9205414, 6 pages, May 1, 1992.
IBM Technical Disclosure Bulletin NN9107269, 5 pages, Jul. 1, 1991.
IBM Technical Disclosure Bulletin NA85035870, 7 pages, Mar. 1, 1985.

*Primary Examiner*—Eddie Lee
*Assistant Examiner*—Douglas W. Owens
(74) *Attorney, Agent, or Firm*—TraskBritt

(57) ABSTRACT

A method for making a flexible metal silicide local interconnect structure. The method includes forming an amorphous or polycrystalline silicon layer on a substrate including at least one gate structure, forming a layer of silicon nitride over the silicon layer, removing a portion of the silicon nitride layer, oxidizing the exposed portion of the silicon layer, removing the remaining portion of the silicon nitride layer, optionally removing the oxidized silicon layer, forming a metal layer over the resulting structure, annealing the metal layer in an atmosphere comprising nitrogen, and removing any metal nitride regions. The local metal silicide interconnect structure may overlie the at least one gate structure.

30 Claims, 6 Drawing Sheets

U.S. PATENT DOCUMENTS

| | | | | |
|---|---|---|---|---|
| 5,483,104 A | | 1/1996 | Godinho et al. | |
| 5,496,750 A | * | 3/1996 | Moslehi | 438/297 |
| 5,568,065 A | | 10/1996 | Wert et al. | |
| 5,589,415 A | | 12/1996 | Blanchard | |
| 5,605,853 A | | 2/1997 | Yoo et al. | |
| 5,612,243 A | * | 3/1997 | Verrett | 438/233 |
| 5,620,919 A | | 4/1997 | Godinho et al. | |
| 5,654,240 A | * | 8/1997 | Lee et al. | 438/647 |
| 5,656,861 A | | 8/1997 | Godinho et al. | |
| 5,668,065 A | * | 9/1997 | Lin | 438/303 |
| 5,670,425 A | | 9/1997 | Schinella et al. | |
| 5,756,394 A | | 5/1998 | Manning | |
| 5,846,881 A | | 12/1998 | Sandhu et al. | |
| 5,913,139 A | * | 6/1999 | Hashimoto et al. | 438/618 |
| 5,946,595 A | * | 8/1999 | Doan et al. | 438/659 |
| 5,981,380 A | | 11/1999 | Trivedi et al. | |
| 6,060,389 A | | 5/2000 | Brennan et al. | |
| 6,083,847 A | * | 7/2000 | Kuo | 438/745 |
| 6,107,154 A | * | 8/2000 | Lin | 438/396 |
| 6,117,761 A | | 9/2000 | Manning | |
| 6,249,015 B1 | * | 6/2001 | Matsuo et al. | 257/296 |
| 6,258,714 B1 | * | 7/2001 | Shrivastava | 438/638 |
| 6,436,805 B1 | * | 8/2002 | Trivedi | 438/618 |

* cited by examiner

SEMICONDUCTOR DEVICE STRUCTURES INCLUDING METAL SILICIDE INTERCONNECT STRUCTURES THAT EXTEND AT LEAST PARTIALLY OVER TRANSISTOR GATE STRUCTURES AND METHODS FOR MAKING THE SAME

CROSS-REFERENCE TO RELATED APPLICATION

This application is a divisional of application Ser. No. 09/291,762, filed Apr. 14, 1999, now U.S. Pat. No. 6,429,124, issued Aug. 6, 2002.

BACKGROUND OF THE INVENTION

1. Field of the Invention

This invention relates generally to the field of integrated circuit design and fabrication. Specifically, the invention relates to methods for making local interconnect structures for integrated circuits and the structures formed thereby.

2. Background of Related Art

Integrated circuits (ICs) contain individual active and passive devices which are interconnected during fabrication by an intricate network of conductive material. The quality of these inter-device interconnections often affects the performance and reliability of the overall IC device.

Local interconnects, unlike other interconnects such as multi-level interconnects, electrically connect the individual devices of the overall IC device at a level or levels below customary metallization levels. For example, local interconnects connect gates and emitters to diffusion areas and N+ and P+ regions across field oxide regions. See T. Tang et al., *Titanium Nitride Local Interconnect Technology for VLSI*, IEEE Trans. Electron Devices, Vol. ED-34, 3 (1987) p. 682, the disclosure of which is incorporated herein by reference.

Several materials have been employed in local interconnects, such as titanium nitride, refractory metals, and titanium silicide ($TiSi_x$). $TiSi_x$ has been used frequently as a local interconnect material because of its low resistance and high conductivity. Methods for fabricating local interconnects, such as $TiSi_x$ local interconnects, include those described in U.S. Pat. Nos. 4,975,756, 5,589,415, 5,605,853, and 5,612,243, the disclosures of which are incorporated herein by reference.

U.S. Pat. No. 5,483,104, the disclosure of which is incorporated herein by reference, discloses a method for fabricating $TiSi_x$ local interconnects. Silicided regions, which protect source and drain regions from an overlying local interconnect, are formed by depositing titanium (Ti) on a silicon (Si) substrate and annealing the titanium to the silicon in a nitrogen atmosphere. The local interconnect structure is then formed on the silicide regions by depositing a doped polysilicon layer, sputtering titanium on the polysilicon, and annealing in a nitrogen atmosphere. Such a technique, however, often results in poor contact between the silicided active area and the silicided local interconnect if the polysilicon deposition is not very well controlled.

Another method for manufacturing $TiSi_x$ local interconnects is disclosed in U.S. Pat. No. 5,496,750 ("the '750 Patent"), the disclosure of which is incorporated herein by reference. The '750 Patent describes a method for fabricating elevated source/drain junction metal-on-silicon field effect transistors (MOSFETs) extending from gate sidewalls to isolation structures surrounding the FET gate area. Unfortunately, the method described in the '750 Patent is limited because the method disclosed therein does not include the fabrication of a flexible local interconnect structure.

Using titanium silicide as a local interconnect can result in several problems, as explained in U.S. Pat. No. 5,341,016, the disclosure of which is incorporated herein by reference. One problem is that titanium silicide severely agglomerates when exposed to temperatures greater than 850° C. Agglomeration can increase both silicided source/drain and polycide sheet resistance and lead to excessive leakage and/or gate oxide degradation. Another problem with titanium silicide is unwanted dopant segregation, which can reduce the minority carrier lifetime during device operation and cause contact resistance problems.

A particular problem with $TiSi_x$ local interconnects has been poor step coverage. Conventionally, in forming the local interconnect, Ti has been deposited first, followed by physical vapor deposition (PVD) of silicon. PVD silicon, however, suffers from poor step coverage. This poor step coverage often detracts from the quality of the semiconductor device.

SUMMARY OF THE INVENTION

The present invention relates to a method for selectively fabricating a flexible metal silicide local interconnect over gates or other structures of a semiconductor device. The method of the present invention includes forming at least one gate structure on a substrate, disposing an amorphous or polycrystalline silicon layer on the substrate, disposing a layer of silicon nitride (SiN) over the silicon layer, removing a portion of the silicon nitride layer, oxidizing the exposed portion of the silicon layer, removing the remaining portion of the silicon nitride layer, optionally removing the oxidized silicon layer, forming a metal layer over the resulting structure, annealing the metal layer in an atmosphere comprising nitrogen, and removing any metal nitride regions. Preferably, the silicon layer is formed on the substrate and the at least one gate structure. In removing the portion of the silicon nitride layer, a remaining portion is preferably left overlying the at least one gate structure. More preferably, the method leaves a local interconnect layer overlying the at least one gate structure.

The present invention provides at least one advantage when compared to conventional local interconnect fabrication methods, in that the present invention forms $TiSi_x$ local interconnects with good step coverage because the silicon forming the interconnects is deposited via chemical vapor deposition (CVD).

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

Certain aspects of the present invention are illustrated by the accompanying drawings in which.

DETAILED DESCRIPTION OF THE INVENTION

This invention provides a flexible metal silicide local interconnect for integrated circuit and semiconductor devices. In particular, the present invention provides a process for forming a flexible local interconnect structure. As used in the context of the present invention, the term "flexible" means that the method of the present invention can be employed to make a local interconnect structure that contacts any desired active device region, or active region, of the semiconductor device and that traverses over gates or other structures of the semiconductor device.

The local interconnects of the present invention can be used in CMOS logic devices and are especially suitable for SRAM devices. The local interconnects and methods of fabrication described below exemplify the inventive process and structure in a CMOS logic device. However, the inventive process and structure as disclosed may be modified to be included in any desired device.

The following description provides specific details, such as material thicknesses and types, in order to provide a thorough understanding of the present invention. The skilled artisan, however, will understand that the present invention may be practiced without employing these specific details. Indeed, the present invention can be practiced in conjunction with fabrication techniques conventionally used in the industry.

The process steps and structures described below do not form a complete process flow for manufacturing IC devices, the remainder of which is known to those of ordinary skill in the art. Accordingly, only the process steps and structures necessary to understand the present invention are described.

Figure 1:
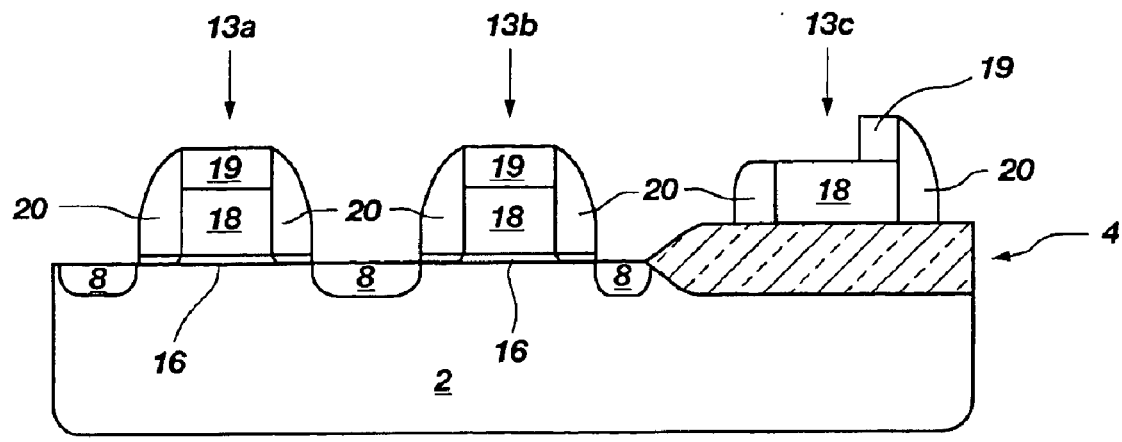
FIGS. 1–9 illustrate cross-sectional views of a process of forming local interconnects, and the resulting structure, according to the present invention.

As shown in FIG. 1, device isolation regions 4 are first formed in substrate 2. Substrate 2 may be any surface suitable for device formation, such as a semiconductor wafer, and may be doped and/or include an epitaxial layer. Preferably, substrate 2 is a silicon wafer or a bulk silicon region, such as a silicon-on-insulator or silicon-on-sapphire structure. Impurities comprising atoms of one conductivity type (e.g., P-type) may optionally be incorporated into the substrate. Device isolation regions 4 are illustrated in FIG. 1 as field oxide regions, but the present invention can be practiced using other isolation technologies, such as trench-and-refill isolation regions.

A thin dielectric layer is then formed over substrate 2. This dielectric layer comprises any dielectric material used in semiconductor device fabrication. Examples of such dielectric materials include silicon oxide, silicon nitride, silicon oxynitride, silicon oxide containing dopants such as B or P, organic dielectrics, or a layered dielectric film of these materials. Preferably, this dielectric layer is silicon oxide. This dielectric layer may be formed by any suitable manufacturing method, such as a thermal reaction or vapor deposition process.

Next, a conductive layer is deposited. Since this conductive layer will form the gate electrode, any suitable gate electrode material may be employed. Preferably, the conductive layer is a doped polysilicon layer. Optionally, a second dielectric layer is formed over this conductive layer. This second dielectric layer may comprise any dielectric material used in IC device fabrication, such as those listed above. This second dielectric layer preferably comprises silicon oxide or silicon nitride. More preferably, this second dielectric layer is silicon oxide.

The conductive layer, dielectric layer, and second dielectric layer (if present) are then patterned and etched, as illustrated in FIG. 1, to form gate structures 13a, 13b, and 13c. The gate structures contain gate dielectric 16, gate electrode 18, and, if desired, second gate dielectric 19. Gate structures 13a, 13b, and 13c can be formed by any suitable pattern and etch process, preferably using substrate 2 as an etch stop.

Sidewall dielectric spacers 20 on the gate structures are then formed. Spacers 20 may be formed by depositing a dielectric layer overall and etching the dielectric layer to leave substantially vertical sidewall dielectric spacers 20. Preferably, this dielectric layer comprises silicon oxide or silicon nitride. More preferably, this dielectric layer is silicon oxide.

Diffusion regions 8, such as source/drain regions, are then formed in substrate 2. Diffusion regions 8 can be formed by implanting a suitable dopant, such as B, As, or P, at an energy and dose sufficient, optionally through a dielectric layer, to form the desired dopant concentration. Diffusion regions 8 may be created by ion implanting a high concentration of dopant atoms into substrate 2 to form doped regions which are aligned to the edge of the dielectric spacers 20. Dielectric spacers 20 can optionally be removed and a second implant performed to form doped regions which are aligned with the gate structures. An optional diffusion step may be employed to drive in the dopants.

Gate contacts, if desired, are then formed. Gate contacts are formed by removing a portion of second gate dielectric 19, if present, to expose the gate electrode 18. This removal can be performed by patterning and etching the second gate dielectric. For example, the pattern and etch may proceed by coating substrate 2 with a first photoresist to planarize the wafer and then baking the first photoresist. The first photoresist is then blanket etched until second gate dielectric 19 is exposed. An isolation mask is then used to isolate second gate dielectric 19. An etch is then conducted to remove the desired portion of the second gate dielectric 19 and expose gate electrode 18, as shown with respect to gate structure 13c.

Figure 2:
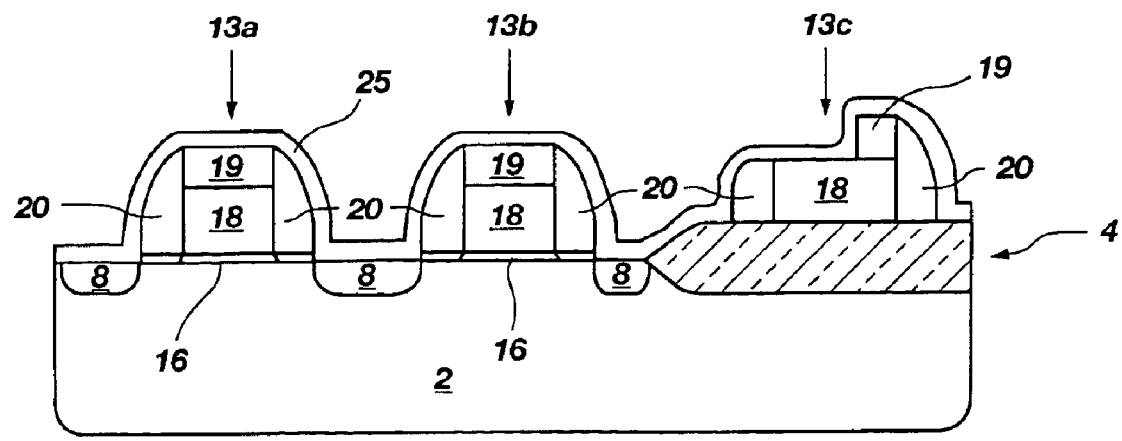

As shown in FIG. 2, a layer 25 of amorphous or polycrystalline silicon is deposited or otherwise formed on substrate 2 and gate structures 13a, 13b and 13c. Preferably, silicon layer 25 is polycrystalline silicon (poly-silicon). The thickness of silicon layer 25 may range from about 300 to about 600 Å, and should be selected considering the device characteristics and processing requirements. For example, the silicon layer 25 thickness should be selected so that the $TiSi_x$ or $CoSi_2$ or any other silicide interconnect forms through the original interface between the deposited silicon and the underlying active areas. Preferably, the thickness of the layer of silicon facilitates the fabrication of a substantially confluent metal silicide layer. Silicon layer 25 may be deposited by any IC device fabrication process yielding the desired chemical and physical characteristics, such as a highly conformal or a partially conformal deposition process. Exemplary processes include a PVD process, such as evaporation or sputtering, or a CVD process. Preferably, silicon layer 25 is deposited by any CVD process yielding good step coverage.

Silicon layer 25, especially when it is poly-silicon, may be optionally doped. The dopant may be ion implanted at a dose and energy sufficient to obtain the desired concentration. Any dopant can be employed, such as As, P, or B.

Figure 3:
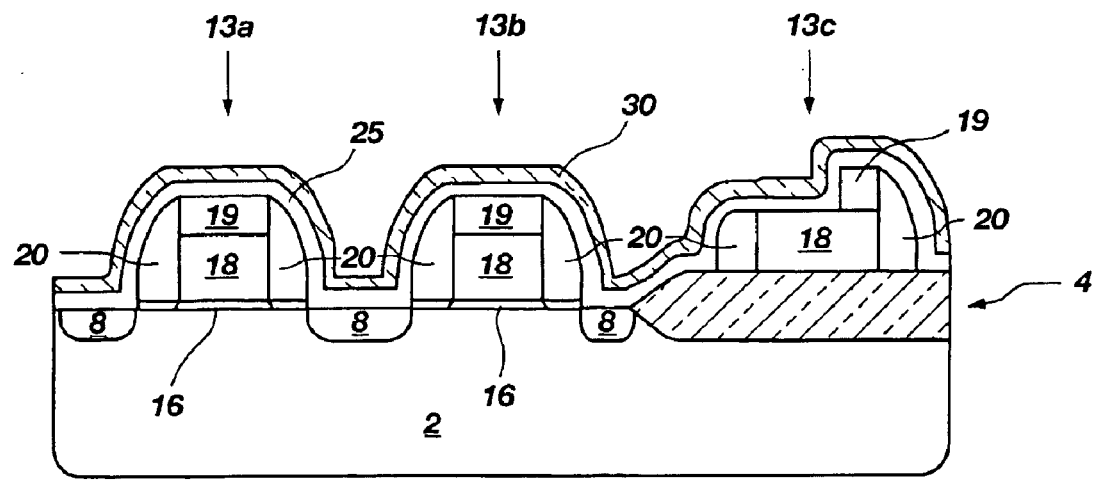

As illustrated in FIG. 3, silicon nitride layer 30 is then deposited or otherwise formed over silicon layer 25. Silicon nitride layer 30 can be deposited by any fabrication method yielding the desired physical and chemical characteristics, such as a CVD or PVD process. Preferably, silicon nitride is deposited using a CVD low-pressure chemical vapor deposition (LPCVD) or plasma-enhanced chemical vapor deposition (PECVD). The thickness of the silicon nitride layer may range from about 100 Å to about 400 Å, and should be selected considering the device characteristics and processing requirements.

Figure 4:
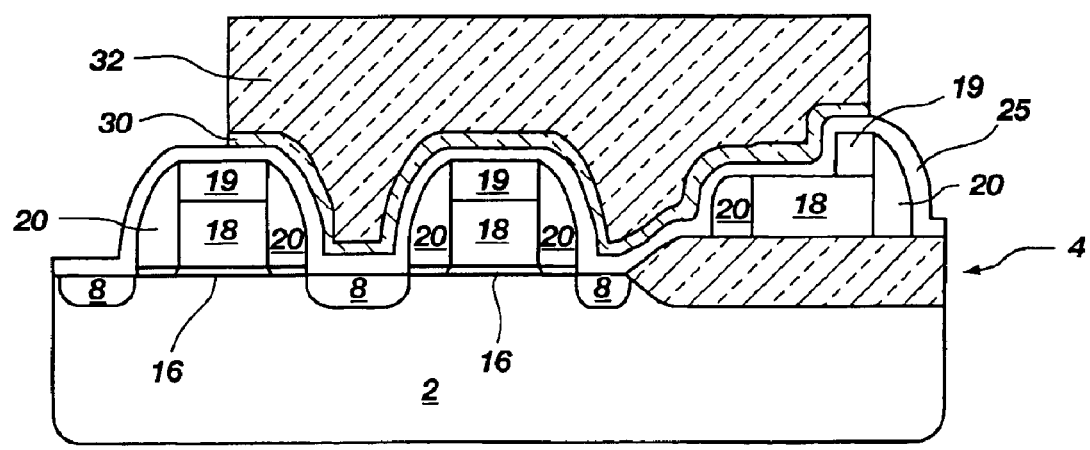

As depicted in FIG. 4, a portion of silicon nitride layer 30 is then removed, the portion of silicon nitride layer 30 remaining on silicon layer 25 overlying those portions of the device on which the silicide local interconnect will be formed. Removal of portions of silicon nitride layer 30 is preferably performed by a photolithographic patterning and etch process using photoresist layer 32, followed by a dry etch of the silicon nitride.

Figure 5:
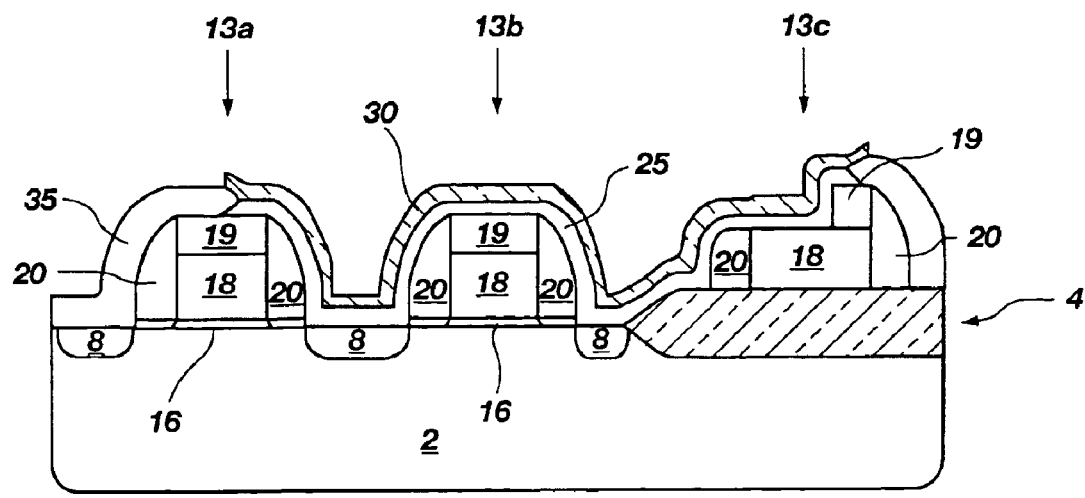

As illustrated in FIG. 4, removing portions of silicon nitride layer 30 will expose underlying regions of silicon layer 25. These exposed regions are then oxidized to form silicon oxide layer 35, as shown in FIG. 5, which is located at the same fabrication elevation, or level, as adjacent, remaining portions of silicon layer 25. Any oxidation process can be employed to oxidize the exposed portions of silicon layer 25, provided it yields a silicon oxide layer 35 with the desired physical and chemical characteristics. Preferably, the oxidation process is thermal oxidation in an atmosphere containing oxygen or steam at a temperature of from approximately 700° C. to 1000° C. for approximately 1 to 30 minutes. Silicon nitride layer 30 serves as an oxidation mask and prevents undesired oxide growth on the portions of silicon layer 25 covered thereby.

Figure 6:
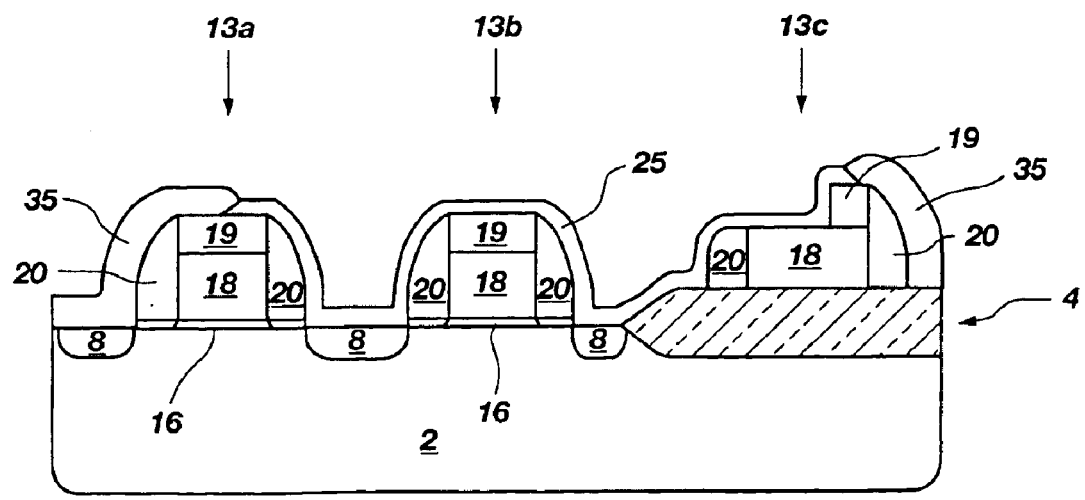

As shown in FIG. 6, the remaining portion of silicon nitride layer 30 is then removed. Any removal process can be employed, provided it neither removes silicon oxide layer 35 nor degrades silicon layer 25. This removal process can be accomplished using a plasma etch or wet strip chemistry using silicon layer 25 as an etch stop. Preferably, the remaining portions of silicon nitride layer 30 are removed using a wet etch solution comprising hot phosphoric acid.

Silicon oxide layer 35 can then be removed, if desired. Whether silicon oxide layer 35 is removed depends on whether the silicon regions underlying the silicon oxide layer 35 will be silicided. For example, as explained below, if silicided diffusion regions 8 are not desired, silicon oxide layer 35 is not removed. Conversely, if silicided diffusion regions 8 are desired, silicon oxide layer 35 is removed. Any suitable fabrication process can be employed to remove the silicon oxide, provided it does not degrade either silicon layer 25 or silicon regions underlying silicon oxide layer 35. For example, this removal process can be accomplished using a plasma etch or wet strip chemistry. Preferably, the silicon oxide layer is removed using a wet etch solution comprising hydrofluoric acid (HF).

Figure 7A:
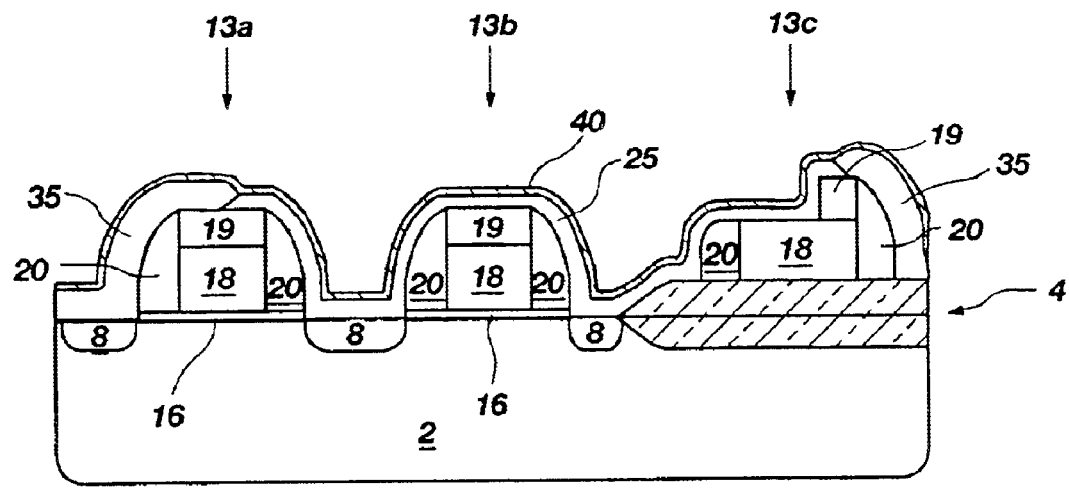
Figure 7B:
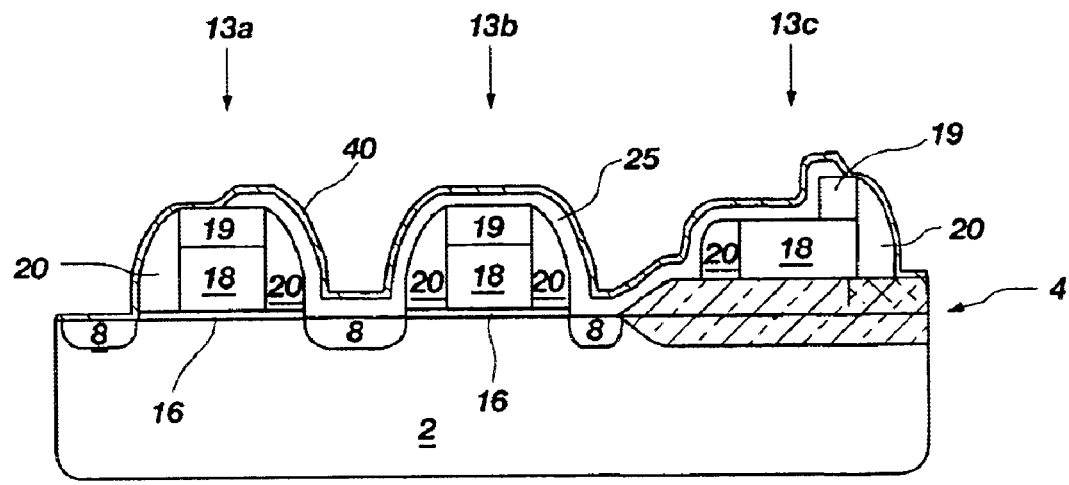

As shown in FIG. 7a (in an embodiment where silicon oxide layer 35 remains) and FIG. 7b (in an embodiment where silicon oxide layer 35 has been removed), metal layer 40 is deposited over the surface of the semiconductor device. Metal layer 40 may be formed by any fabrication process imparting the necessary characteristics to the layer, such as a PVD or CVD process. Preferably, metal layer 40 is formed by a sputtering process, such as sputter deposition in an Ar atmosphere.

The metal layer may comprise any metal or material which forms a silicide when alloyed with silicon, such as a refractory metal. Preferably, the metal is Co, Ta, or Ti. More preferably, the refractory metal layer is Ti. The thickness of the metal layer should be proportional to the thickness of the silicon layer. The thickness of the layer of metal should be sufficient to substantially completely consume the silicon as the metal and silicon are annealed. For example, if Ti is employed as the metal, the thickness of the layer of Ti should be about half of the thickness of the layer of silicon to substantially completely consume the silicon layer. The thickness of the metal layer should also be sufficient to facilitate the fabrication of a substantially confluent metal silicide layer during the annealing of the metal to the silicon. Preferably, the thickness should range from about 200 to about 400 Å.

Figure 8A:
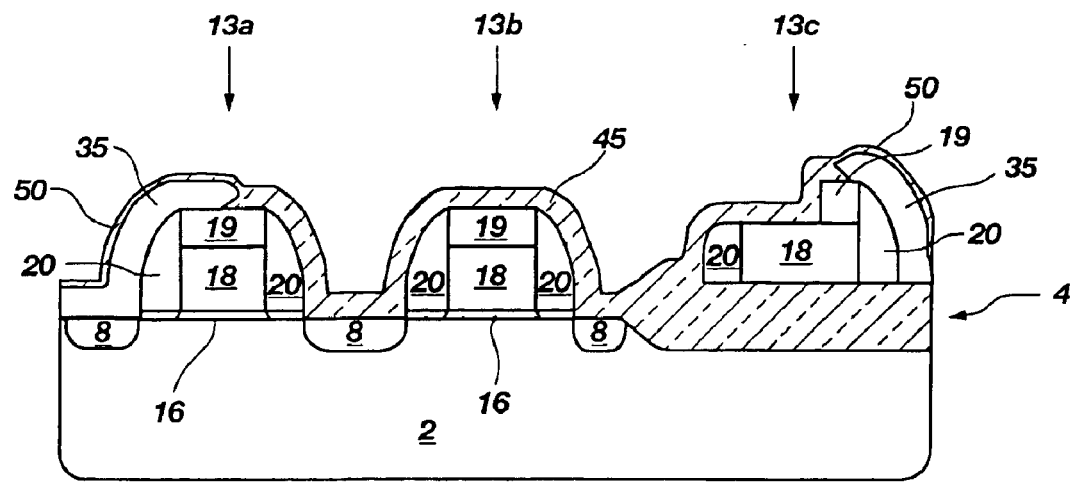
Figure 8B:
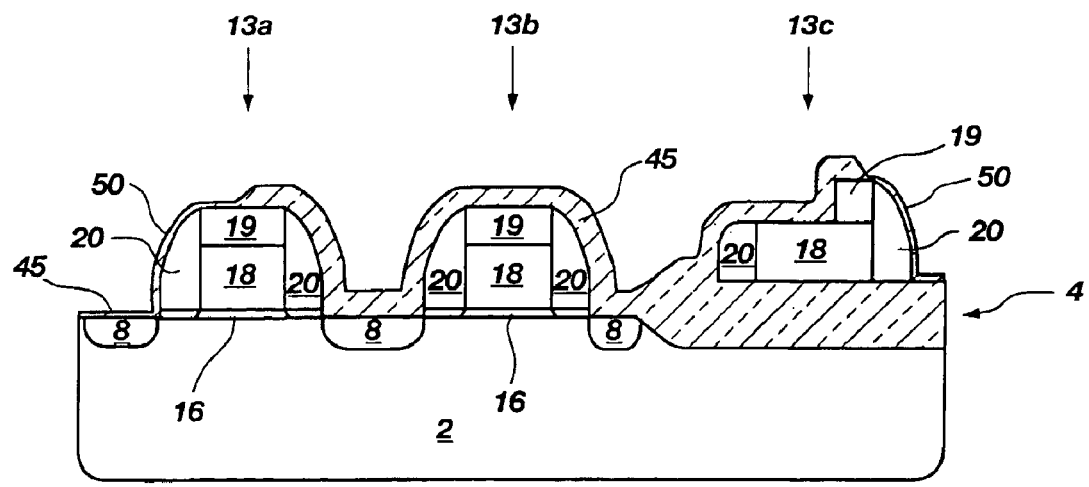

As depicted in FIG. 8a (in an embodiment where silicon oxide layer 35 remains) and FIG. 8b (in an embodiment where silicon oxide layer 35 has been removed), metal layer 40 is then converted to silicide interconnect 45 and metal nitride layer 50. Preferably, this conversion is performed by annealing in a nitrogen-containing atmosphere. The annealing initiates a chemical reaction between the metal layer and the underlying silicon and between the metal and the nitrogen ambient. A metal silicide layer forms in the regions where the metal contacts silicon, thereby yielding silicide interconnect 45. Metal nitride layer 50 forms in the regions where the metal contacts an insulating or dielectric material.

The annealing process is performed in a nitrogen-containing atmosphere for a time and a temperature sufficient to react metal layer 40 and silicon layer 25 and form a suicide; thus, silicide interconnect 45 is located at substantially the same fabrication elevation, or level, as that at which silicon layer 25 was previously located and, in FIG. 8a, where silicon oxide layer 35 remains, at substantially the same fabrication elevation, or level, as silicon oxide layer 35. Preferably, the temperature ranges from about 600 to about 750 0° C. and the time ranges from about 20 seconds to about 10 minutes.

The nitrogen-containing atmosphere may comprise a gas or a mixture of gases providing nitrogen for the annealing atmosphere, yet not adversely influencing conversion of the metal layer. Examples of such gases include nitrogen, ammonia, or a mixture thereof. Preferably, the nitrogen-containing atmosphere contains substantially pure nitrogen. The annealing atmosphere may also contain other gases, such as argon or hydrogen.

This conversion process should proceed until a metal silicide forms through the original interface between silicon layer 25 and underlying substrate 2. The time and temperature of the annealing process, as well as the thickness of silicon layer 25, must therefore be selected carefully.

Figure 9A:
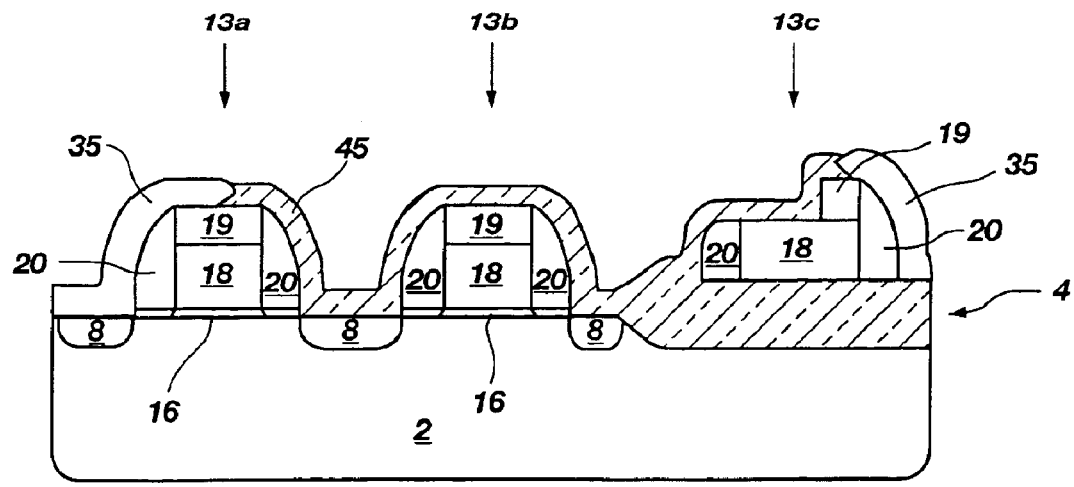
Figure 9B:
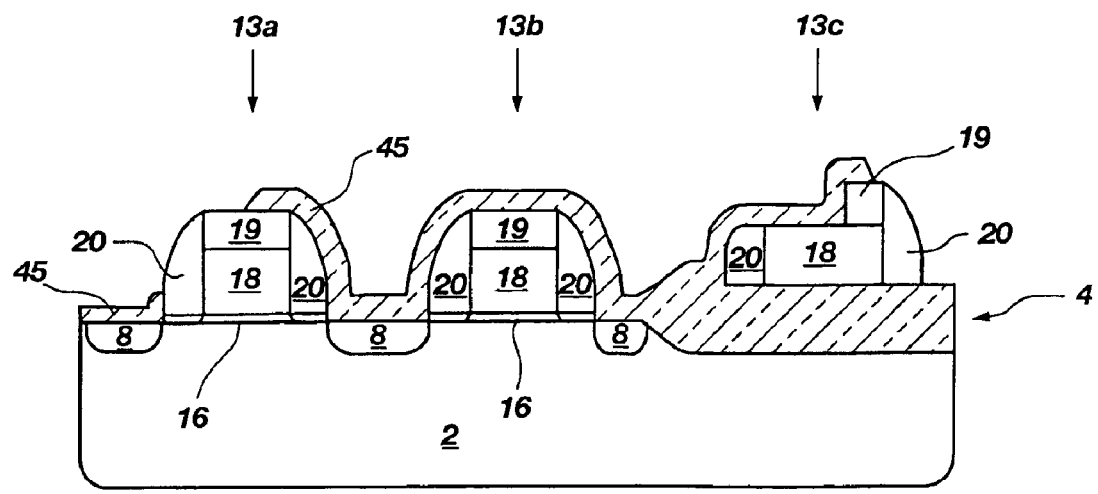

Metal nitride layer 50 is then removed to obtain the structures shown in FIG. 9a (in an embodiment where silicon oxide layer 35 remains) and FIG. 9b (in an embodiment where silicon oxide layer 35 has been removed). Any process for removing the metal nitride layer 50 without removing or adversely affecting silicide interconnect 45 may be employed. A wet etch solution containing $H_2O$, $H_2O_2$, and $NH_4OH$ can be used to remove the metal nitride layer 50 without etching away the silicide interconnect 45.

After removing the metal nitride layer 50, subsequent processing may be undertaken to form the desired semiconductor device. For example, a high temperature anneal may be performed to reduce the silicide interconnect sheet resistivity. Additionally, a dielectric layer could be deposited, contact holes formed in the dielectric layer, and a patterned metal layer formed to achieve a desired pattern of electrical interconnections.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A semiconductor device structure, comprising:
   at least one active device region;
   at least one transistor gate structure positioned laterally adjacent to the at least one active device region; and
   an interconnect comprising a layer including metal silicide and positioned to directly contact the at least one active device region;
   a film comprising dielectric material at substantially the same fabrication level of the semiconductor device structure as the interconnect; and
   a film comprising a metal nitride over at least portions of the film comprising dielectric material.

2. The semiconductor device structure of claim 1, wherein the interconnect is also positioned to extend substantially over another transistor gate structure of the semiconductor device structure.

3. The semiconductor device structure of claim 1, wherein the metal silicide comprises titanium silicide, tantalum silicide, or cobalt silicide.

4. The semiconductor device structure of claim 1, wherein the metal suicide comprises titanium silicide.

5. The semiconductor device structure of claim 1, wherein the at least one active region comprises an n-well.

6. A semiconductor device structure, comprising:
at least one active device region;
at least one structure comprising a dielectric material positioned laterally adjacent to the at least one active device region; and
an interconnect comprising a layer including metal silicide;
a film comprising dielectric material at substantially the same fabrication level of the semiconductor device structure as the interconnect; and
a film comprising metal nitride over at least portions of the film comprising dielectric material.

7. The semiconductor device structure of claim 6, wherein the at least one active device region comprises an n-well.

8. The semiconductor device structure of claim 6, wherein the at least one structure comprises a transistor gate structure.

9. The semiconductor device structure of claim 8, wherein the dielectric material of the at least one structure comprises a side wall of the transistor gate structure.

10. The semiconductor device structure of claim 6, wherein the dielectric material of the at least one structure comprises a silicon oxide.

11. The semiconductor device structure of claim 6, wherein the metal silicide comprises a refractory metal silicide.

12. The semiconductor device structure of claim 11, wherein the refractory metal silicide comprises titanium silicide, tantalum silicide, or cobalt silicide.

13. The semiconductor device structure of claim 6, wherein the metal silicide comprises titanium silicide.

14. The semiconductor device structure of claim 1, wherein the interconnect is positioned to extend at least partially over the at least one transistor gate structure.

15. The semiconductor device structure of claim 1, wherein the film comprising dielectric material comprises a silicon oxide.

16. The semiconductor device structure of claim 6, wherein the interconnect is positioned at least partially over the dielectric material of the at least one structure.

17. The semiconductor device structure of claim 16, wherein the dielectric material of the at least one structure comprises at least one of a silicon oxide and a silicon nitride.

18. The semiconductor device structure of claim 6, wherein the film comprising dielectric material comprises a silicon oxide.

19. A semiconductor device structure, comprising:
a semiconductor substrate;
at least two active device regions formed in the semiconductor substrate;
at least three transistor gate structures flanking the at least two active device regions, a center transistor gate structure being positioned between the at least two active device regions; and
a conductive element comprising metal silicide in communication with the at least two active device regions and contacting a conductive line of a contacted transistor gate structure of the at least three transistor gate structures, the conductive element extending over the center transistor gate structure without contacting a conductive line thereof.

20. The semiconductor device structure of claim 19, wherein the contacted transistor gate structure is positioned at least partially over a field isolation region at an active surface of the semiconductor substrate.

21. The semiconductor device structure of claim 19, wherein the conductive element extends at least partially over a remaining transistor gate structure of the at least three transistor gate structures.

22. The semiconductor device structure of claim 19, further comprising:
a film comprising dielectric material at substantially the same fabrication level as the conductive element.

23. The semiconductor device structure of claim 22, wherein the film comprising dielectric material comprises a silicon oxide.

24. A semiconductor device structure, comprising:
a semiconductor substrate;
at least two active device regions formed in the semiconductor substrate;
at least three transistor gate structures flanking the at least two active device regions, including a center transistor gate structure positioned between the at least two active device regions and a contacted transistor gate structure positioned at least partially over a field isolation region; and
a conductive element comprising metal silicide in communication with the at least two active device regions and a conductive line of the contacted transistor gate structure extending over the center transistor gate structure without contacting a conductive line thereof.

25. The semiconductor device structure of claim 24, wherein the contacted transistor gate structure is positioned at least partially over a field isolation region at an active surface of the semiconductor substrate.

26. The semiconductor device structure of claim 24, wherein the conductive element extends at least partially over a remaining transistor gate structure of the at least three transistor gate structures.

27. A semiconductor device structure, comprising:
a semiconductor substrate;
at least two active device regions formed in the semiconductor substrate;
at least three transistor gate structures flanking the at least two active device regions, a center transistor gate structure being positioned between the at least two active device regions;
a conductive element comprising metal silicide in communication with the at least two active device regions and a conductive line of a contacted transistor gate structure of the at least three transistor gate structures, the conductive element extending over the center transistor gate structure without contacting a conductive line thereof; and
a film comprising dielectric material at substantially the same fabrication level as the conductive element.

28. The semiconductor device structure claim 27, wherein the contacted transistor gate structure is positioned at least partially over a field isolation region at an activate surface of the semiconductor substrate.

29. The semiconductor device structure of claim 27, wherein the conductive element extends at least partially over a remaining transistor gate structure of the at least three transistor gate structures.

30. The semiconductor device structure of claim 27, wherein the film comprising dielectric material comprises a silicon oxide.

* * * * *